(12) United States Patent
Choi et al.

(10) Patent No.: US 10,790,035 B2
(45) Date of Patent: Sep. 29, 2020

(54) METHOD OF OPERATING STORAGE DEVICE

(71) Applicants: ESSENCORE Limited, Wanchai (HK); Young Joon Choi, Gyeonggi-do (KR)

(72) Inventors: Young Joon Choi, Gyeonggi-do (KR); Seok Cheon Kwon, Gyeonggi-do (KR)

(73) Assignees: ESSENCORE LIMITED, Wanchai (HK); Young Joon Choi, Gyeonggi-do (KR)

( * ) Notice: Subject to any disclaimer, the term of this patent is extended or adjusted under 35 U.S.C. 154(b) by 125 days.

(21) Appl. No.: 15/993,043

(22) Filed: May 30, 2018

(65) Prior Publication Data

US 2019/0362796 A1    Nov. 28, 2019

(30) Foreign Application Priority Data

May 28, 2018    (KR) .................. 10-2018-0060468

(51) Int. Cl.
  *G11C 16/34* (2006.01)
  *G11C 11/56* (2006.01)
  (Continued)

(52) U.S. Cl.
  CPC ........ *G11C 16/349* (2013.01); *G06F 11/1068* (2013.01); *G11C 11/5628* (2013.01); *G11C 11/5635* (2013.01); *G11C 11/5642* (2013.01); *G11C 16/0483* (2013.01); *G11C 16/14* (2013.01); *G11C 16/20* (2013.01);
  (Continued)

(58) Field of Classification Search
  CPC ... G11C 16/349; G11C 16/20; G11C 16/0483; G11C 16/26; G11C 16/14; G11C 11/5635; G11C 11/5642; G11C 11/5628; G11C 29/52; G06F 11/1068; H01L 27/11524; H01L 27/11556
  See application file for complete search history.

(56) References Cited

U.S. PATENT DOCUMENTS

2014/0359202 A1* 12/2014 Sun .................. G11C 16/34
                                                  711/103
2018/0276073 A1*  9/2018 Ide .................. G06F 11/1068

OTHER PUBLICATIONS

Cai et. al., "Data retention in MLC NAND flash memory: Characterization, optimization, and recovery", 2015 IEEE 21st International Symposium on High Performance Computer Architecture (HPCA), pp. 551-563, Feb. 7, 2015 (Year: 2015).*

* cited by examiner

*Primary Examiner* — April Y Blair
*Assistant Examiner* — Rong Tang
(74) *Attorney, Agent, or Firm* — Mendelsohn Dunleavy, P.C.; Steve Mendelsohn; Kevin Dunleavy

(57) ABSTRACT

Disclosed is a method of operating a storage device including a NAND flash memory including memory cells grouped into blocks, each block being divided into pages. According to the method, a controller in the storage device loads, onto a memory region, a look-up table containing first read reference voltage sets corresponding to respective retention degradation stages of the NAND flash memory and second read reference voltages sets corresponding to respective pages which vary in terms of the threshold voltages. Subsequently, the controller performs a read operation on the memory cells on a per-block basis by using the first read reference voltage set corresponding to a current retention degradation stage, the second read reference voltage set corresponding to a current page, or both, until all of the memory cells in a current block are correctly read.

8 Claims, 9 Drawing Sheets

(51) Int. Cl.
*G11C 16/26* (2006.01)
*G11C 16/20* (2006.01)
*G11C 16/14* (2006.01)
*G06F 11/10* (2006.01)
*G11C 29/52* (2006.01)
*G11C 16/04* (2006.01)
*H01L 27/11556* (2017.01)
*H01L 27/11524* (2017.01)

(52) U.S. Cl.
CPC .............. *G11C 16/26* (2013.01); *G11C 29/52* (2013.01); *H01L 27/11524* (2013.01); *H01L 27/11556* (2013.01)

| look-up table | R1 | R2 | R3'(=R3 +△Vt) |

| State Division | P0(P1 or P2) | | P1(P2 or P3) |
|---|---|---|---|
| look-up table | R11(R21 or R31) (@T1) | R12(R22 or R32) (@T2) | R13(R23 or R33) (@T3) |

| State Division | P0(P1 or P2) | | P1(P2 or P3) |
|---|---|---|---|
| First look-up table | R11(R21 or R31) (@T1) | R12(R22 or R32) (@T2) | R13(R23 or R33) (@T3) |
| Second look-up table | R111(R211 or R311) (@G1 or G2 or G3) | R122(R222 or R322) (@G1 or G2 or G3) | R133(R233 or R333) (@G1 or G2 or G3) |

| State Division | P0(P1 or P2) | P1(P2 or P3) |
|---|---|---|
| First look-up table | RW1(RW2 or RW3) ||
| Second look-up table | CR1(CR2 or CR3) ||

| State Division | P0(P1 or P2) | | P1(P2 or P3) |
|---|---|---|---|
| First look-up table | R11(R21 or R31) (@T1) | R12(R22 or R32) (@T2) | R13(R23 or R33) (@T3) |
| Second look-up table | R110(R210 or R310) (@T1) | R120(R220 or R320) (@T2) | R130(R230 or R330) (@T3) |

METHOD OF OPERATING STORAGE DEVICE

CROSS REFERENCE TO RELATED APPLICATION

The present application claims priority to Korean Patent Application No. 10-2018-0060468, filed May 28, 2018, the entire contents of which is incorporated herein for all purposes by this reference.

BACKGROUND OF THE INVENTION

1. Field of the Invention

The present invention relates to a method of operating a storage device, such as a NAND flash memory-based storage device.

2. Description of the Related Art

Generally, a storage device is used as an auxiliary memory for supplementing the memory capacity of a main memory such as a core memory, a read only memory (ROM), and a random access memory (RAM) of a personal computer. Herein, the storage device refers to a mass storage device such as a hard disk drive (HDD) or a solid state drive (SSD). However, a description provided herein below will be limited to an SSD for convenience in describing the present invention.

In a storage device, a memory controller therein is electrically connected to a host device, thereby interfacing data communication between the host device and an internal NAND flash memory of the storage device. The NAND flash memory includes 2D planar NAND memory cells or 3D vertical NAND memory cells, thereby functioning as a recording medium. The NAND flash memory is a nonvolatile memory that can retain stored data or information even in a power-off state.

The overall reliability of a NAND flash memory-based storage device gradually degrades with use, due to frequent operations, device aging over time, and external factors such as environmental temperature. Reliability degradation issues for NAND flash memory-based storage devices will be described in detail below with reference to FIGS. 1 and 2.

That is, during operation of a storage device, a NAND flash memory provided in the storage device undergoes repeated program and erase (P/E) operations controlled by an electrical signal transmitted from a controller. As the number of P/E cycle counts of the NAND flash memory increases, the NAND flash memory cells suffer unintentional parasitic charge traps, or internal rearrangement or migration of stored charge in the cells, resulting in shifting of threshold voltage distributions of the NAND flash memory cells.

A recent NAND flash memory uses a plurality of threshold voltages to discriminate among a plurality of cell charge states, i.e., one from another. The cell charge state of each memory cell is determined through a read operation in which the amount of charge stored in a corresponding cell is sensed and it is recognized as a logical value by checking the threshold voltage thereof. The parasitic charge unintentionally trapped in each cell will constitute part of the total charge in the corresponding cell, thereby increasing the charge in the cell as compared with the charge written to the cell. Therefore, the charge state of the cell will be misread as a different logical value from the originally written, resulting in a raw bit error.

FIG. 1 is a graph illustrating factors influencing a raw error bit rate of a NAND flash memory. In FIG. 1, two lower curves 4 and 8 illustrate a relationship between raw bit error rates and P/E cycle counts of two NAND flash memories. The raw bit error rate is also influenced by environmental temperature (i.e. storage temperature) of the NAND flash memory. That is, a high environmental temperature accelerates the charge loss of memory cells, resulting in an increase in the raw bit error rate.

In FIG. 1, two upper curves 14 and 18 illustrate a relationship between raw bit error rates and P/E cycle counts of the two NAND flash memories after the two NAND flash memories corresponding to the curves 4 and 8 undergo a bake process (thermal process). In any case, that is, irrespective of the absence and presence of the bake process, the raw bit error rate of the NAND flash memories increases with the P/E cycle count in a similar fashion although the absolute values of the raw bit error rates before and after the bake process differ.

The latter two NAND flash memories exhibit higher raw bit error rates than the former two NAND flash memories at a given P/E cycle count because the former two NAND flash memories suffer from only the parasitic charge trap while the latter two NAND flash memories suffer from both the parasitic charge trap and the thermal stress which is a more dominant factor on the raw bit error rate. To minimize the raw bit error rate of a NAND flash memory, a controller is equipped with an error correction code (ECC) algorithm having a function of correcting raw bit errors that occur during a read operation of a NAND flash memory.

To help with understanding of a read operation of a NAND flash memory, a description will start with the overall structure of a NAND flash memory. The NAND flash memory includes an array of NAND flash memory cells respectively disposed at crossing points of word lines and bit lines. For an N-bit multi-level cell (MLC) NAND flash memory, each of the flash memory cells thereof is programmed to any one of $2^N$ threshold voltage states separated by $2^N-1$ read reference voltages, each being interposed between corresponding two adjacent threshold voltage states.

FIG. 2 is a graph illustrating the threshold voltage distribution of two stages S1 and S2. The read operation of the NAND flash memory is performed in a manner described below. First, word lines connected to memory cells are applied with predefined read reference voltages (also called default read reference voltages). Then, during a bit line sensing period, the charge of each of the memory cells is transferred to a corresponding bit line, so that the charge of the memory cells can be detected via the bit line. Then, the detected threshold voltage of each of the cells is iteratively compared with all of the predefined read reference voltages each of which defines a logical value, to determine the stored N-bit logical value of the corresponding memory cell.

For an N-bit MLC NAND flash memory, in a read operation of the memory cells, $2^N-1$ predefined read reference voltages are used to discriminate among $2^N$ possible threshold voltage states (i.e., possible logical values), in which each of the $2^N-1$ predefined read reference voltages is typically set to the middle point between its adjacent threshold voltage stages among the $2^N$ threshold voltage states. As illustrated in FIG. 2, for example, a predefined read reference voltage V1 (illustrated in a vertical solid line) is located between two adjacent threshold voltage states S1 and S2.

The characteristics of a storage device are influenced by the environmental temperature during manufacture and storage of the flash memory as a discrete part or as a component mounted in a storage the storage device. The cells of a NAND flash memory mounted in the storage device experience the charge loss which is accelerated by a high ambient temperature during manufacturing processes, delivery, or storage thereof. Therefore, an event is likely to occur in which one threshold voltage state S2 of the two threshold voltage states S1 and S2 shifts toward the read reference voltage V1 (i.e., to the left side in FIG. 2, indicated by an arrow F). As a result, the probability of the cells programmed to the threshold voltage state S2 is represented by a dotted-line parabolic form.

However, a user who obtains (purchases) a NAND flash-based storage device which has undergone the leftward shifting of the threshold voltage state S2 will try to read the cell charge states of the NAND flash memory of the storage device with a default read reference voltage (e.g., a read reference voltage in factory settings) V1. In this case, the read operation with the default read reference voltage V1 will result in that the memory cells having threshold voltages that actually fall within a tail portion of the distribution of the threshold voltage state S2, which is lower than the default read reference voltage V1, will be misread as a logical value different from a written value, so that the memory cells being determined read error bits.

That is, when the default read reference voltage V1 of the NAND flash memory has not been modified in accordance with use conditions of the NAND flash memory but is maintained at in factory settings and, some cells having threshold voltages falling within the tail portion of the distribution of the threshold voltage state S2 will be determined as raw error bits. In this case, when the number of raw error bits exceeds the ECC correction capability, a read retry operation is performed. That is, a read operation is retried on those cells by using a different read reference voltage (for example, a reserved read reference voltage V2 or a reserved read reference voltage V3) which is lower than the default read reference voltage V1, instead of using the default read reference voltage V1 for the read operation. This read retry operation is continuously performed until all of the cells corresponding to the tail portion are correctly read. Therefore, the tail portion of the distribution of the threshold voltage state S2 is the cause of increasing the read latency of the NAND flash memory.

In addition, for those cells falling within the tail portion of the distribution of the threshold voltage state S2, meaning that the cells have their threshold voltages lower than the default read reference voltage V1, the controller initially performs an error mitigation operation using an error correction code (ECC) algorithm so that those cells can be correctly read. When the number of cells having the threshold voltages within the tail portion of the distribution of the threshold voltage state S2 exceeds the ECC correction capability, the controller performs a read retry operation using a read retry algorithm provided in the NAND flash memory. That is, the controller modifies the default read reference voltage V1 using the read retry algorithm to correctly read the contents of the cells. In the read retry operation, a second read operation is performed on the cells having the threshold voltages within the tail portion of the distribution of the threshold voltage state S2 by using the modified read reference voltage.

In FIG. 2, the read retry algorithm adjusts the default read reference voltage V1 which was used for a first read operation on some cells to the left side so that the value of the default read reference voltage V1 will approach the reserved read reference voltage V2 or V3, and then performs a second read operation on the cells with the use of the resulting reference voltage R2 or R3, thereby reducing or even completely eliminating read errors of the tail portion of the distribution of the threshold voltage state S2. Here, the read reference voltage V3 may be determined as the optimum read reference voltage V3 with which no bit errors are generated.

FIG. 2 illustrates an example of a read retry operation in which one default read reference voltage V1 and two reserved read reference voltages V2 and V3 are used. For an N-bit MLC NAND flash memory, $2^N-1$ default read reference voltages and two or more reserved read reference voltages for each of two adjacent threshold voltage states of a corresponding one of the $2^N-1$ default read reference voltages are prepared. This has a disadvantage of increasing the read latency and the power consumption of the NAND flash memory.

The optimum read reference voltages for respective threshold voltage states are obtained through the repeated read operations according to the read retry algorithm. However, this process significantly lowers the overall read performance of the NAND flash memory cells. Therefore, a solution to solve this problem is required. For example, several reserved read reference voltages for each logical value, which will be preliminarily, experimentally, and statistically determined by taking into account the threshold voltage shift characteristics of NAND flash memory cells, and may be provided as stored in a look-up table by the manufacturers or users of the NAND flash memory cells. In this case, a controller will simply read the look-up table to learn optimum read reference voltages for respective logical values and perform a read retry operation with the learned optimum read reference voltage.

SUMMARY OF THE INVENTION

Accordingly, the present invention has been made keeping in mind the above problems occurring in the related art, and an object of the present invention is to provide a method of operating a storage device, the method being capable of suitably performing a read operation without causing read errors by efficiently setting one or more read reference voltages for discriminating between threshold voltage states, to one or more appropriate values, respectively, each value being positioned between corresponding two adjacent threshold voltage states, while taking into account external factors such as thermal stress, keeping time, and word line loading effect.

In order to accomplish the above object, the present invention provides a method of operating a storage device including an N-bit multi-level cell (MLC) NAND flash memory including an array of memory cells grouped into a plurality of pages for a read or write operation which is performed on a per-page basis and into a plurality of blocks for an erase operation which is performed on a per-block basis, each block comprising a plurality of pages, each of the memory cells being programmed to any one of $2^N$ threshold voltage states separated by $2^N-1$ read reference voltages (N is a natural number and represents the number of bits), the method comprising: by a controller provided in the storage device, loading a look-up table, into a memory region, containing a plurality of first read reference voltage sets and a plurality of second read reference voltage sets, the first read reference voltage sets corresponding to respective threshold voltage shift amounts varying depending on retention degradation stages of the memory cells for each block, the second read reference voltage sets corresponding to respective threshold voltage shift amounts varying depending on pages in one block of the plurality of blocks; and by the controller, performing a read operation on the memory cells block by block, using the first read reference voltage set corresponding to a current retention degradation stage of the corresponding block, the second read reference voltage set, or both until all of the memory cells in the corresponding block are correctly read.

The look-up table may be created by the controller after the controller checks read margins, each read margin being a voltage gap every between two adjacent threshold voltage states of the $2^N$ threshold voltage states, based on a positional relationship between each of the $2^N-1$ read reference voltages and each of the $2^N$ threshold voltage states, after the storage device comprising the NAND flash memory and the controller is manufactured.

The current retention degradation stage may be determined by performing a read operation on the memory cells in one block of the NAND flash memory while sequentially applying the first read reference voltage sets and the second read reference voltage sets, one after another, and selecting a retention degradation stage corresponding to the read reference voltage with which the cells in the block are correctly read as a current retention degradation degree for the corresponding block.

When the read operation performed on the cells with the first reference voltage set and the second read reference voltage set corresponding to the current retention degradation stage is failed, another read operation may be sequentially performed on the memory cells block by block, using a different first read reference voltage set and a different second read reference voltage set corresponding to a different retention degradation stage.

The first read reference voltage set may be obtained by extracting a common read window for the plurality of pages at the retention degradation stage of the look-up table, wherein the read reference voltage set includes voltages selected within the common read window.

When the read operation using all of the read reference voltages within the look-up table is failed, a soft decision error correction operation may be performed in which a read operation is further performed with a read reference voltage obtained by adding or subtracting an offset reference voltage to and from the first read reference voltage, based on a latest retention stage of the cells in one block and a position of a page in the block.

According to the present invention, it is possible to appropriately adjusting default read reference voltages while taking into account external factors (e.g., thermal stress, keeping time, and word line loading effect) influencing the performance of a NAND flash memory-based storage device such that each of the adjusted initial read reference voltages is surely positioned between its adjacent voltage states. That is, the default read reference voltages (initially set read reference voltages) are appropriately adjusted according to various use conditions of the storage device. Therefore, it is possible to perform a read operation on the flash memory cells without causing read errors. The present invention also has an advantage of reducing read latency and power consumption for operation of a NAND flash memory.

BRIEF DESCRIPTION OF THE DRAWINGS

The above and other objects, features and other advantages of the present invention will be more clearly understood from the following detailed description taken in conjunction with the accompanying drawings, in which:

FIGS. 4 to 5 illustrate a read retry algorithm according to a first embodiment for use in the storage device of FIG. 3, wherein FIG. 4 is a graph and FIG. 5 is a table;

FIGS. 6 to 8 illustrate a ready retry algorithm according to a second embodiment for use in the storage device of FIG. 3, wherein FIGS. 6 and 7 are graphs and FIG. 8 is a table;

FIGS. 9 to 12 illustrate a read retry algorithm according to a third embodiment for use in the storage device of FIG. 3, wherein FIG. 9 is a cross-sectional view, FIG. 10 is a perspective view, FIG. 11 is a graph, and FIG. 12 is a table;

FIGS. 13 to 14 illustrate a read retry algorithm according to a fourth embodiment for use in the storage device of FIG. 3, wherein FIG. 13 is a graph and FIG. 14 is a table; and FIGS. 15 to 16 illustrate a read retry algorithm according to a fifth embodiment for use in the storage device of FIG. 3, wherein FIG. 15 is a graph and FIG. 16 is a table.

DESCRIPTION OF THE PREFERRED EMBODIMENTS

Hereinafter, preferred embodiments of the present invention will be described in detail with reference to the accompanying drawings, so that those skilled in the art can easily carry out the present invention.

Figure 1:
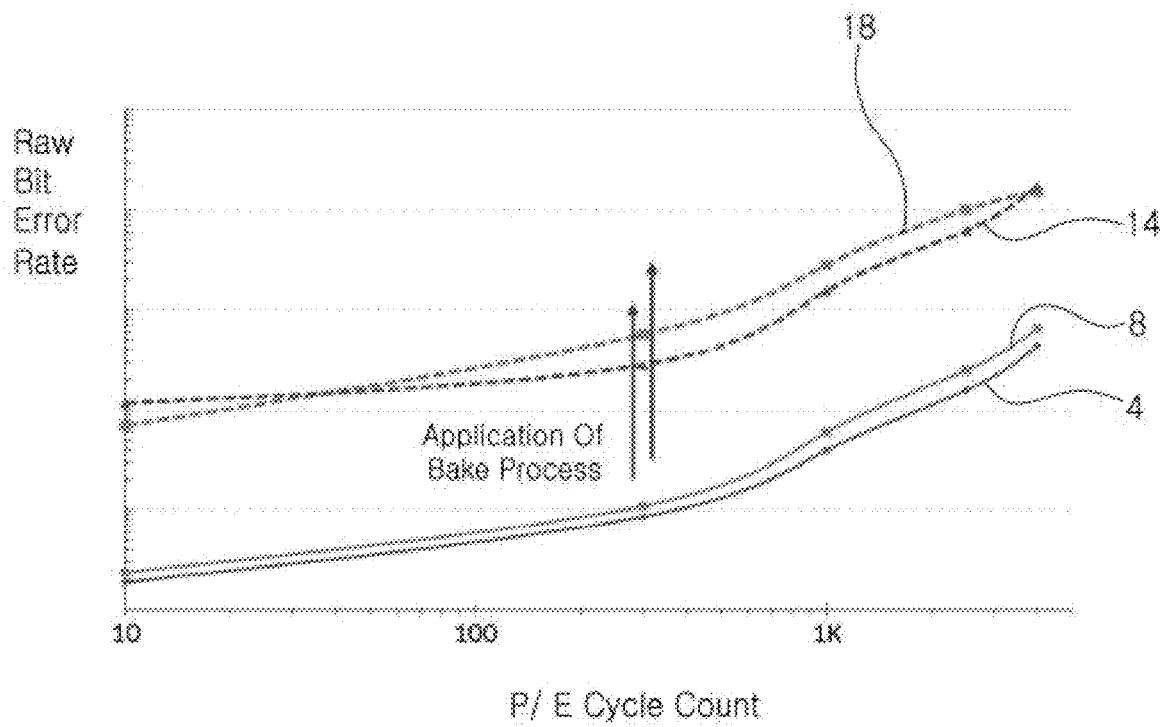
FIG. 1 is a graph illustrating a relationship between a raw bit error rate and a program/erase (P/E) cycle count associated with the electrical performance degradation of a NAND flash memory of a conventional storage device.
Figure 2:
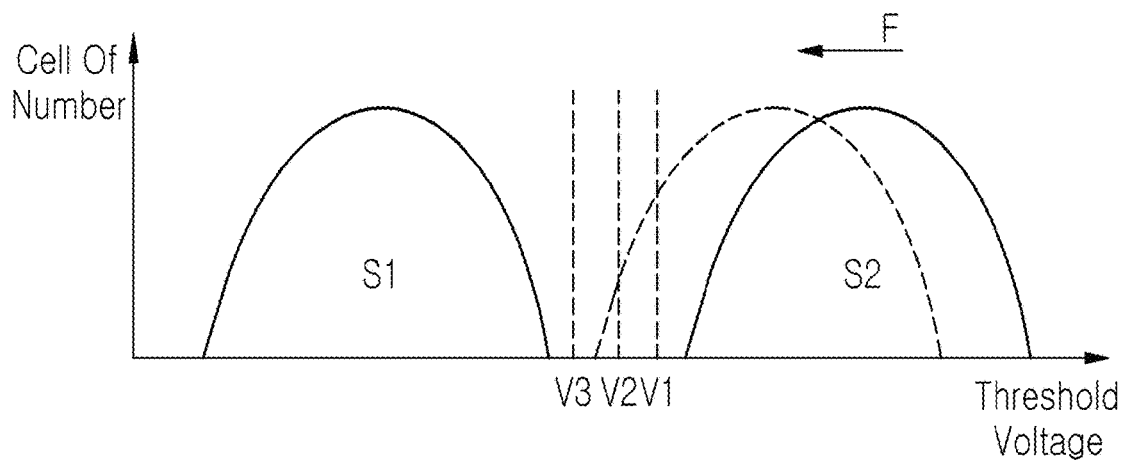
FIG. 2 is a threshold voltage distribution graph illustrating threshold voltage states and the probability thereof in a NAND flash memory of a conventional storage device which is influenced by environmental temperatures, the graph being presented to describe a read retry algorithm.
Figure 3:
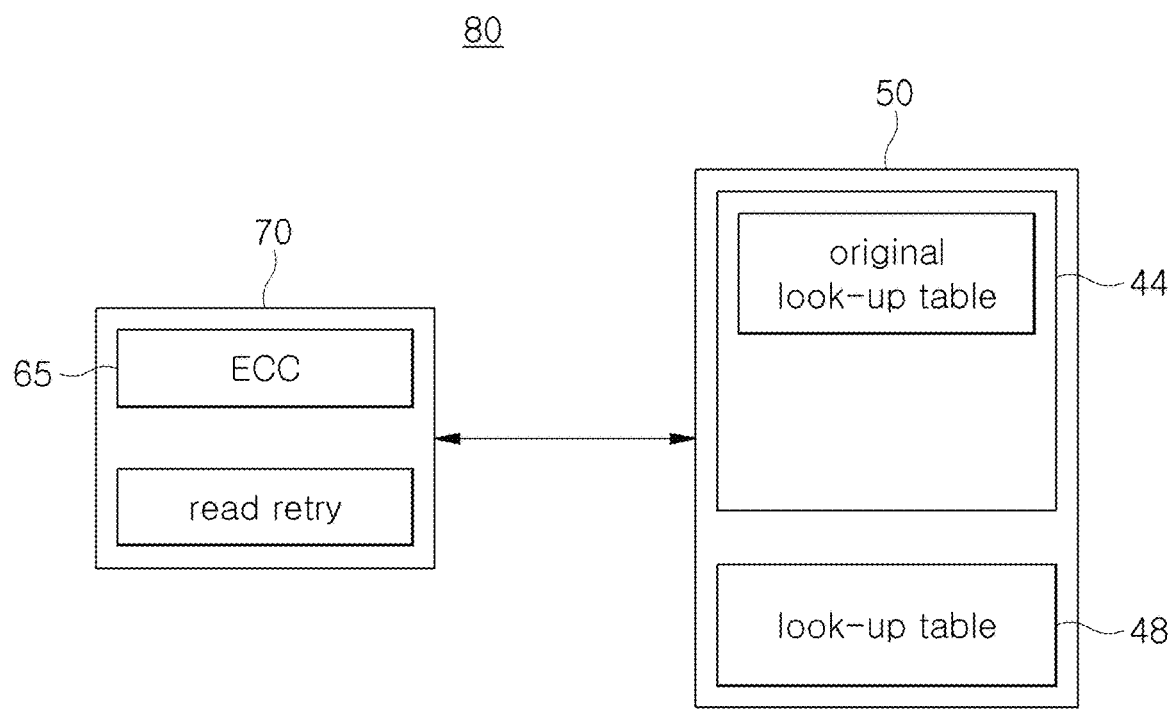
FIG. 3 is a block diagram schematically illustrating the overall configuration of a storage device according to the present invention.

FIG. 3 is a block diagram schematically illustrating the overall configuration of a storage device according to one embodiment of the present invention.

Referring to FIG. 3, a storage device 80 includes a NAND flash memory 50 and a controller 70 that are electrically connected to each other. The NAND flash memory 50 has an operation information storage region 44 and a data storage region 48. Information stored in the operation information storage region 44 includes read reference voltages used as reference values to discriminate between cell charge states of the NAND flash memory 50 and operation values that are used by an internal drive circuit to calibrate or initialize various analog circuits required for operation of the NAND flash memory 50.

Additionally, the manufacturer of the NAND flash memory 50 which is a part of the storage device provides a user or manufacturer of the storage device with a default look-up table in which offset values for modifying default read reference voltages are specified. The default look-up table may be provided as stored within a region of the NAND flash memory 50. The controller 70 of the storage device will read the default look-up table to perform a read retry operation.

The offset value is a value by which the default read reference voltage is tuned higher or lower within a read margin between two adjacent threshold voltage states.

For convenience in describing the present invention and for comparison with the default look-up table specifying default read reference voltages, a new look-up table composed of other read reference voltages is created. The data storage region 48 is a memory region that can be programmed by an external device. The controller 70 is provided with an error correction code (ECC) algorithm 65.

To find a correct position (value) of each of a plurality of read reference voltages, the read retry algorithm keeps track of the shifts of at least one threshold voltage state (a higher threshold voltage state, a lower threshold voltage, or both) of two threshold voltage states adjacent to the corresponding read reference voltage. After finding the correct position of the read reference voltage between the corresponding adjacent threshold voltage states, that is, finding a new read reference voltage, the read retry performs a second read with the read reference voltage when an initial read exhibited a high error rate, thereby reducing or completely eliminating read errors attributable to the shifts of the threshold voltage states.

Further details of the read retry algorithm will be described below with reference to FIGS. 4 to 16.

Figure 4:
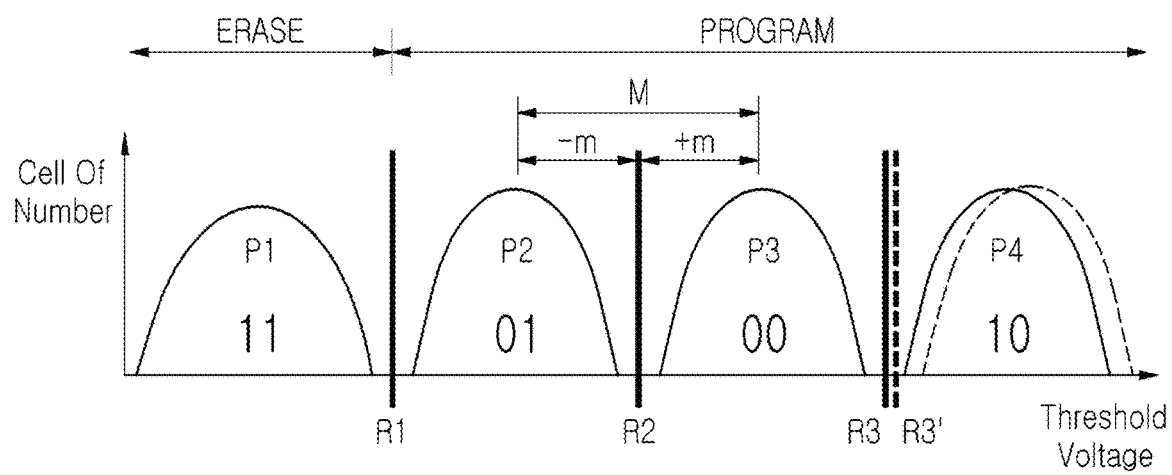
Figures 5, 6:
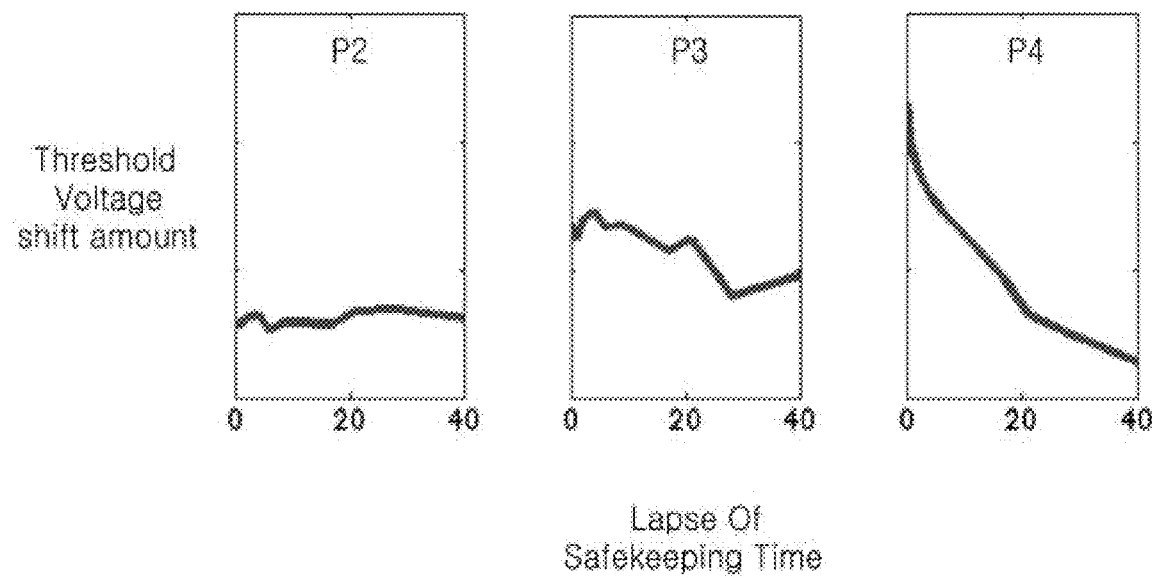

FIGS. 4 and 5 illustrate a read retry algorithm according to a first embodiment of the present invention which is to be embedded in the storage device of FIG. 3.

Referring to FIGS. 4 and 5, the read retry algorithm adjusts the default read reference voltages R1, R2, and R3. The adjustment of the default read reference voltages R1, R2, and R3 is performed in accordance with actual use conditions of the storage device 80 on the basis of a threshold voltage distribution graph of FIG. 4.

The adjustment of the default read reference voltages can be performed in accordance with use conditions of the storage device 80, for example, particularly taking into account: pre-treating stress generated to the NAND flash memory 50 during a thermal endurance test performed by the manufacturer of the NAND flash memory 50 after the NAND flash memory 50 is manufactured; heat stress generated to the NAND flash memory 50 while the NAND flash memory 50 is mounted in the storage device 80 using a surface mounting technology (SMT) by the manufacturer of the storage device 80; etc. Therefore, since the last use conditions are taken into account in the adjustment of the default read reference voltages, more accurate read reference voltages than the default read reference voltages set in factory settings of the NAND flash memory 50 can be set.

More particularly, the process of adjusting (i.e., modifying) the default read reference voltages will be performed in a manner described below. The controller 70 performs a read operation on the NAND flash memory 50, and finds positional relationships between a read reference voltage (for example, R3) and each of two adjacent threshold voltage states (for example, V3 and V4), on the basis of the threshold voltage distribution graph. When the default read reference voltage R3 is deviated from the middle point between the two adjacent threshold voltage states P3 and P4, the controller 70 sets at least one reserved read reference voltage R3' to a voltage within a read margin between the peaks of the distributions of the two adjacent threshold voltage states P3 and P4, and moves the default read reference voltage R3 toward the middle point between the two adjacent threshold voltage states P3 and P4 while tracing the movement of the reserved reference voltage R3'. Through this process, an optimum read reference voltage to be used for correctly discriminating between the adjacent threshold voltage states P3 and P4 can be obtained.

The process of finding the positional relationships of the two adjacent threshold voltage states P3 and P4 with respect to the default read reference voltage R3 includes a process in which the controller 70 checks the default read reference voltage R3 located between two adjacent threshold voltage states P3 and P4. Initially, the default read reference voltages R1, R2, and R3 have offset values 0, 0, and 0 respectively.

Next, the process of adjusting the default read reference voltage R3 and finding the optimum read reference voltage R3' includes a process in which the controller 70 extracts an ECC-correctable range while moving the default read reference voltage R3 higher or lower by a predetermined differential within a read margin between the two adjacent threshold voltage states P3 and P4.

It is preferable to set the optimum read reference voltage R3' to the middle point of the extracted ECC-correctable range. However, it will be set while taking into account the shift direction and amount of the threshold voltage of the NAND flash memory cells attributable to retention degradation. The optimum read reference voltage R3' will be obtained by decreasing the default read reference voltage R3 by an amount corresponding to the threshold voltage shift amount when the threshold voltages of the cells are down-shifted (decreased) or by increasing the default read reference voltage R3 by an amount corresponding to the threshold voltage shift amount when the threshold voltages of the cells are up-shifted (increased). The value of the obtained optimum read reference voltage R3' will be recorded in the look-up table.

When the actual shift amount of the threshold voltages of the cells of the NAND flash memory 50 at a given retention age within a target retention duration exceeds a read offset limit, which is the ECC-correctable range, and a read reference value specified in data-sheet specifications of the NAND flash memory 50, a retry offset will be performed. Typically, regardless of the number of per-cell data bits, the same amount of retention degradation occurs. Therefore, in the case of three-bit cells that have a smaller read margin than two-bit cells, there is a far more probability that the shifted threshold voltage resulting from the retention degradation exceeds the read reference voltage. Therefore, at the time of designing the NAND flash memory, a plurality of read reference voltages for each cell charge state needs to be mapped on the default read reference voltage so that, from among them, an appropriate read reference voltage will be selectively used according to the retention degradation stage of the NAND flash memory.

The read operation can be repeatedly performed while selectively using the read reference voltages from one after another until the data of a read target cell is correctly read (ECC correction success). However, such an operation lowers the read operation performance of the storage device 80. Therefore, desirably, the retention degradation stage of the cells of the NAND flash memory will be continuously kept track of, and a read reference voltage associated with the corresponding retention degradation stage will be simply selected by referring to the look-up table. This error correction method has an advantage of preventing the read operation performance of the storage device 80 from being deteriorated.

The read reference voltage R3' is a value obtained by adding a threshold voltage shift amount $\Delta Vt$ of a read target cell to the default read reference voltage R3 (i.e., R3'=R3+$\Delta Vt$). Thus, the read reference voltages R1, R2, and R3' have respective offset values 0, 0, and +$\alpha$. The threshold voltage shift amount $\Delta Vt$ corresponds to an offset value +$\alpha$.

According to one modification to the first embodiment of the present invention, a look-up table is obtained by tuning each of the default read reference voltages R1, R2, and R3 to be higher or lower by a predetermined amount.

Figures 7, 8:
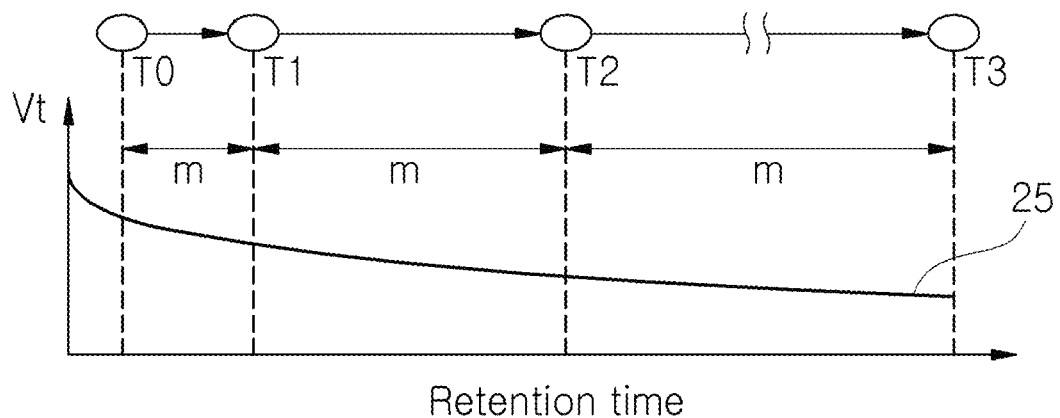

FIGS. 6 to 8 illustrate a read retry algorithm according to a second embodiment of the invention, to be used in the storage device of FIG. 3.

Referring to FIGS. 6 to 8, the read retry algorithm is configured to adjust the default read reference voltages R1, R2, and R3 (refer to FIG. 4). The adjustment of each of the default read reference voltages R1, R2, and R3 is performed by the controller 70 on the basis of a threshold voltage distribution graph (refer to FIG. 4). The adjustment is performed according to a read error margin M between two adjacent threshold voltage states P1 and P2, or P2 and P3, or P3 and P4.

The adjustment of the default read reference voltage for each threshold voltage stat is performed according to a read error margin M between two adjacent threshold voltage states P1 and P2, P2 and P3, or P3 and P4, and a retention degradation stage of the NAND flash memory 50, which is determined on the basis of the elapsed time after the NAND flash memory 50 is manufactured by the manufacturer of the NAND flash memory 50, and the elapsed time after the storage device 80 in which the NAND flash memory 50 is mounted is manufactured by the manufacturer of the storage device 80. Therefore, more accurate read reference voltages can be set according to the retention degradation stage of the NAND flash memory, than the default read reference voltage set by the manufacturer of the NAND flash memory 50.

Before describing the process of adjusting the default read reference voltages in detail, it should be noted that the retention degradation of the NAND flash memory more severely worsens at the programmed threshold voltages states (P2, P3, and P4 of FIG. 4) than the erased threshold voltage state (P1 of FIG. 4) with the lapse of safekeeping time of the NAND flash memory, in terms of the threshold voltage shift amount as illustrated in FIG. 6.

This is because the cells programmed to the programmed threshold voltage states P2, P3, and P4 hold more electrons in the floating gates thereof than the cells programmed to the erased threshold voltage state P1. In the threshold voltage distribution graph of FIG. 4, the programmed threshold voltage states P2, P3 and P4 are arranged in voltage increasing order from the left-hand side to the right-hand side. That is, the voltage levels of the programmed threshold voltage states are higher in order of P2, P3, and P4, and the threshold voltage shift amounts of the respective program threshold voltage states are also in the same order.

The adjustment of the default read reference voltages is performed in a manner described below. That is, the controller 70 first performs a read operation on the cells of the NAND flash memory 50, and then finds the positional relationship of each of the read reference voltages R1, R2, and R3 with respect to the two adjacent threshold voltage state pairs P1 and P2, P2 and P3, and P3 and P4, respectively. On the threshold voltage distribution graph of FIG. 4, any one of the default read reference voltage R1, R2, and R3 is not located at the middle point between the corresponding two adjacent threshold voltage states P1 and P2, or P2 and P3, or P3 and P4, the controller 70 divides the read error margin M which is a voltage range between the peaks of the distributions of the two adjacent threshold voltage states P1 and P2, or P2 and P3, or P3 and P4 into two halves, thereby obtaining a half-read error margin m. The controller 70 overlays the threshold voltage change curve (denoted by reference numeral 25 in FIG. 7) of the NAND flash memory 50 on the retention time table in which the current time point T0 and the maximum safekeeping time point (the end of the designed retention duration) T3 of the NAND flash memory 50 are marked, and then segments a remaining retention duration between T0 and T3 at regular intervals of the half read margin m so that the retention duration between T0 and T3 is segmented into multiple time bins in each of which the NAND flash memory exhibits an equal threshold voltage shift amount and each time bin represents a retention degradation stage. Then, the controller 70 moves the default read reference voltage R1, R2, or R3 toward the middle point between the corresponding two adjacent threshold voltage states P1 and P2, or P2 and P3, or P3 and P4 on the threshold voltage distribution graph, and obtains first read reference voltages R11, R21, and R31 for the respective read reference voltages R1, R2, and R3 at time point (first retention degradation stage) T1 at which a first time bin of the remaining retention duration ends, or first read reference voltages R12, R22, and R32 for the respective read reference voltages R1, R2, and R3 at time point (second retention degradation stage) T2 at which a second time bin of the remaining retention duration ends, or first read reference voltages R13, R23, and R33 for the respective read reference voltages R1, R2, and R3 at time point (last time degradation stage) T3 at which a third time bin (last bin) of the remaining retention duration ends.

Hereinafter, the two adjacent threshold voltage states P1 and P2 will be denoted by reference numeral P1/P2, the two adjacent threshold voltage states P2 and P3 will be denoted by reference numeral P2/P3, and the two adjacent threshold voltage states P3 and P4 will be denoted by reference numeral P3/P4. Reference numerals R11, R21, and R31 represent the first read reference voltages obtained by moving the default read reference voltage R1 for respective time points T1, T2, and T3, respectively. Reference numerals R12, R22, and R32 represent the first read reference voltages obtained by moving the default read reference voltage R2 for respective time points T1, T2, and T3, respectively.

Reference numerals R13, R23, and R33 represent the first read reference voltages obtained by moving the default read reference voltage R3 for time points T1, T2, and T3, respectively. The process of finding the relationship between the two adjacent threshold voltage states P1/P2, P2/P3, or P3/P4 and the corresponding default read reference voltages R1, R2, or R3 includes a process in which the controller 70 checks the default read reference voltage R1, R2, or R3 placed between the two adjacent threshold voltage states P1/P2, P2/P3, or P3/P4.

The process of obtaining the first read reference voltages R11/R21/R31 for time point T1, the first read reference voltages R12/R22/R32 for time point T2, and the first read reference voltages R13/R23/R33 for time T3 by moving the default read reference voltage R1, R2, and R3 is performed in a manner described below. While the controller 70 moves the default read reference voltage R1, R2, or R3 toward the middle point between the two adjacent threshold voltage states P1/P2, P2/P3, or P3/P4, when a total change in the default read reference voltage R1, R2, or R3 reaches or exceeds the half read margin m at time point T1, T2, or T3, the threshold voltage calculated with respect to time point T1, T2, or T3 is determined as the optimal read reference voltage R11/R21/R31 for time point T1, R21/R22/R32 for time point T2, and R13/R23/R33 for time point T3. Then, the controller 70 creates a lookup containing the estimated optimal read reference voltage R11/R21/R31 for time point T1, R12/R22/R23 for time point T2, and R13/R23/R33 for time point T3, as illustrated in FIG. 8, and writes the look-up table to the data storage region 48 of the NAND flash memory 50.

Figure 9:
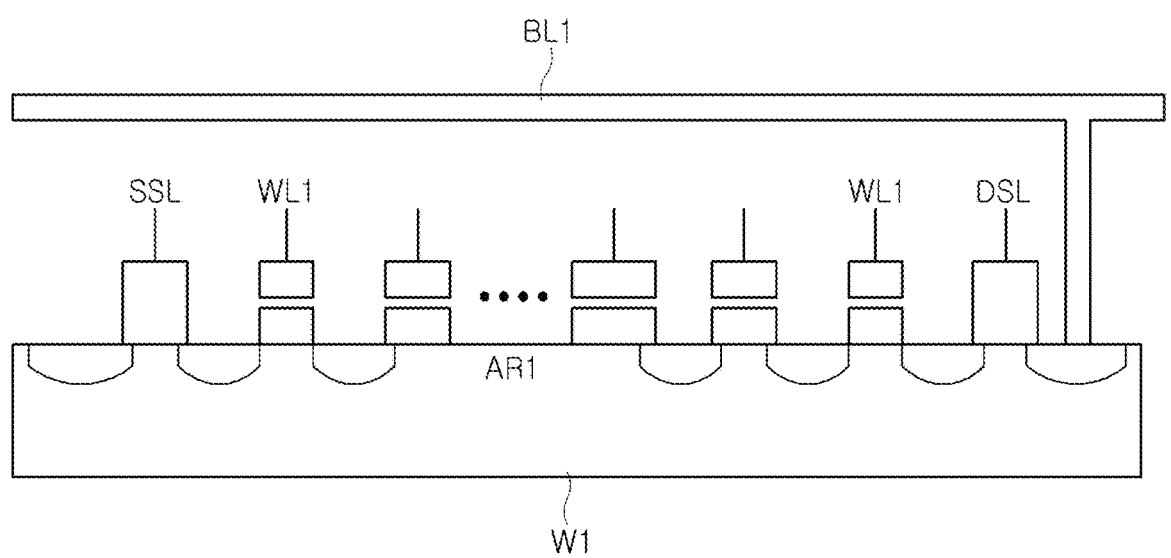
Figure 10:
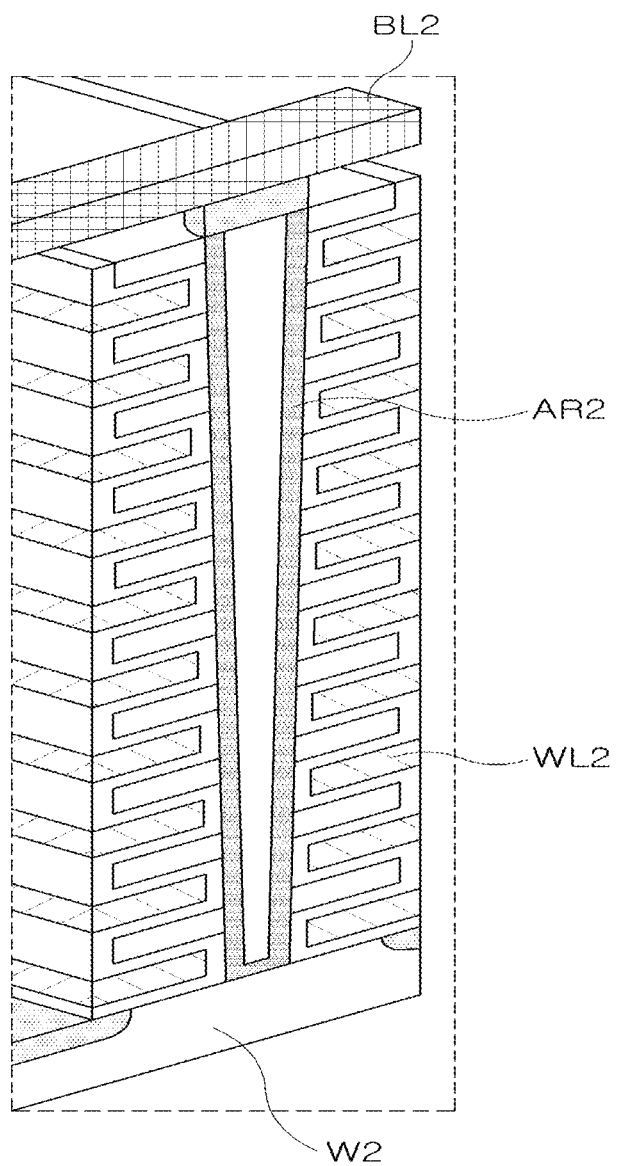
Figures 11, 12:
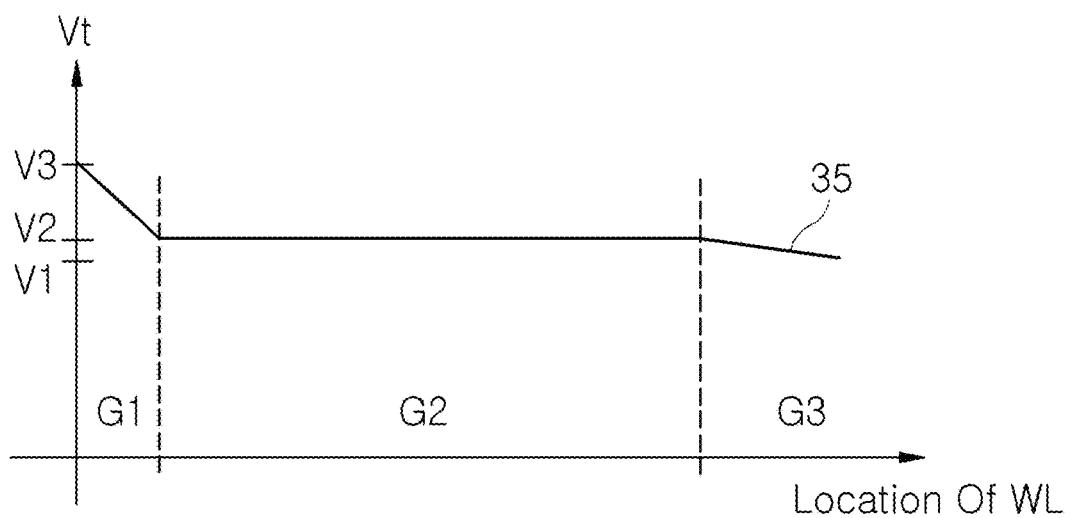

FIGS. 9 to 12 illustrate a read retry algorithm according to a third embodiment of the present invention, which is to be used in the storage device of FIG. 3, wherein FIG. 9 is a schematic cross-sectional view, FIG. 10 is a perspective view, FIG. 11 is a graph, and FIG. 12 is a table.

Referring to FIGS. 9 to 12, the read retry algorithm is configured to adjust the positions (i.e., values) of the default read reference voltages (R1, R2, and R3 of FIG. 4). The adjustment of the default read reference voltages is performed by the controller 70. The adjustment is performed according to the read error margin M between the two adjacent threshold voltage states P1 and P2, or P2 and P3, or P3 and P4, and to the location of each word line group of the NAND flash memory 50.

The adjustment of the default read reference voltages is performed according to the retention degradation stage of the NAND flash memory 50 mounted in the storage device 80 by taking into account the elapsed time after the NAND flash memory 50 is manufactured as a discrete device by the manufacturer of the NAND flash memory 50 and the elapsed time after the NAND flash memory 50 is mounted in the storage device 80 by the manufacturer of the storage device 80. In addition, the adjustment of the default read reference voltages is performed according to the read error margin M between the two adjacent threshold voltage stages P1 and P2, or P2 and P3, or P3 and P4 on the basis of the threshold voltage distribution graph of FIG. 4, and according to the location of each word line group in the NAND flash memory 50. Therefore, more accurate optimum read reference voltages can be set while taking into account the retention degradation stage than the default read reference voltages set by the manufacturer of the NAND flash memory 50.

Before describing the process of adjusting the default read reference voltages in this way, it should be noted that the retention degradation of the NAND flash memory 50 occurs due to the fact that word lines WL1 associated one string of one block of the NAND flash memory 50 have different sizes according to positions across the surface of a semiconductor substrate W1 when the NAND flash memory 50 is composed of two-dimensionally arranged cells as illustrated in FIG. 9, and the fact that word lines WL2 associated with one string of one block of the NAND flash memory 50 have different sizes according to positions in the vertical direction on the surface of a semiconductor substrate W2 when the NAND flash memory 50 is composed of three-dimensionally arranged cells as illustrated in FIG. 10.

The reason why the sizes of the word lines arranged in a lengthwise direction of one string vary will be described in more detail below. For each cell, any word line (for example, WL1) is composed of a floating gate and a control gate. Electrons are charged into the floating gate from the semiconductor substrate W1, W2 during a write operation and are discharged from the floating gate to the semiconductor substrate W1, W2 during an erase operation. The threshold voltage of each cell is determined according to the number of electrons in the floating gate. In this way, the threshold voltage of each cell is controlled. However, the electrical property of the word lines vary depending on a cell group due to the variation in the resistance of cells which are connected in series in one string of the NAND flash memory 50, and due to the loading effect occurring in etching and doping during manufacturing of the NAND flash memory 50. The loading effect commonly appears because the patterns at end portions of one string are irregular and sparse but the patterns of the cells at a middle portion of the string are regular and dense.

On the other hand, in the case of the three-dimensionally arranged cells illustrated in FIG. 10, the width of each word line WL2 increases with the distance from the surface of the semiconductor substrate W2 in the vertical direction because the channels (i.e., the active region AR2) for the cells are arranged in series in the vertical direction along the wall surface of a vertically elongated tapered hole, meaning that the size of the channels of the cells increases with the distance from the surface of the semiconductor substrate W2 due to the tapered profile of the active region. The word lines WL2 are famed to surround the channels (active regions AR2) famed on the wall surface of the tapered hole, thereby correspondingly increasing in size with the distance from the surface of the semiconductor substrate W2 as with the case of the channels. The variation in the electrical property of the word lines WL2 according to positions thereof in the vertical direction is attributable to the fact that the program speed for a lower cell is lower than the program speed for an upper cell due to the variation in voltage density according to the size of the word lines.

For the cells connected as one string in one block of the NAND flash memory 50, the threshold shift amount of the cells varies according to the locations thereof across the semiconductor substrate W1 or W2. The cells of a given string may be grouped into three word line groups G1, G2, and G3 according to the locations thereof, while taking into account the threshold voltage shift amounts on the basis of the threshold voltage curve 35.

The adjustment of the default read reference voltages will be performed in a manner described below. First, the controller 70 performs a read operation on the cells of the NAND flash memory 50. Then, the controller 70 checks the positional relationship of the default read reference voltage R1 or R2 or R3 with respect to each of the two adjacent threshold voltage states P1/P2, P2/P3, or P3/P4 on the basis of the threshold voltage distribution graph of FIG. 4. As a result of the checking, on the threshold voltage distribution graph of FIG. 4, when the default read reference voltage R1, R2, or R3 is spaced from the middle point between the corresponding two adjacent threshold voltage states P1/P2, P2/P3, or P3/P4, the controller 70 finds a read error margin M between the corresponding two adjacent threshold voltage states P1/P2, P2/P3, or P3/P4, and divides the read error margin M into two halves m (herein, each half will be referred to as a half read error margin m). Then, as illustrated in FIG. 7, the controller 70 overlays a threshold voltage change curve 25 of the NAND flash memory 50 on a retention time table in which a current time point T1 and a maximum safekeeping time point T3 of the NAND flash memory 50 are marked. Then, the controller 70 segments the time length from T1 to T3, at intervals of the half read error margin m, into a plurality of time bins in each of which an equal threshold voltage shift occurs. Then, the controller 70 moves the default read reference voltage R1, R2, or R3 so as to approach the middle point between the corresponding two adjacent threshold voltage states P1/P2, P2/P3, or P3/P4, on the threshold voltage distribution graph illustrated in FIG. 4. Then, the controller 70 finds first read reference voltages R11/R21/R31 for time point T1, R12/R22/R32 for time point T2, and R13/R23/R33 for time point T3. Then, the controller 70 moves the first read reference voltages R11/R21/R31 for time point T1, R12/R22/R32 for time point T2, or R13/R23/R33 for time point T3, while taking into account the threshold voltage shifts of the memory cells according to the locations of the word lines thereof which are grouped into the word line groups G1, G2, and G3, thereby finding second read reference voltages R111/R211/R311 for time point T1, R122/R222/R322 for time T2, or R133/R233/R333 for time point T3.

Regarding reference numerals of the two adjacent threshold voltage states, reference numerals P1/P2, P2/P3, and P3/P4 respectively represent the two adjacent threshold voltage states P1 and P2, P2 and P3, and P3 and P4, respectively. Regarding reference numerals of the first read reference voltages, reference numeral R11/R21/R31 represents the first read reference voltage changed from the default read reference voltage R1 for time point T1, T2, or T3. Reference numeral R12/R22/R32 represents the first reference voltage changed from the default read reference voltage R2 for time point T1, T2, or T3.

Reference numeral R13/R23/R33 represents first read reference voltage changed from the default read reference voltage R3 for time point T1, T2, or T3. Regarding reference numerals indicating the second read reference voltages, reference numeral R111/R211/R311 represents a second read reference voltage R111, R211, or R311 found from any one of the word line groups G1, G2, and G3. Reference numeral R122/R222/R322 represents a second read reference voltage found from any one of the word line groups G1, G2, and G3. Reference numeral R133/R233/R333 represents a second read reference voltage found from any one of the word line groups G1, G2, and G3.

The finding of the positional relationship between each of the read reference voltages R1, R2, and R3 and the corresponding adjacent threshold voltage states P1/P2, P2/P3, or P3/P4 includes a process in which the controller 70 checks the position of each of the default read reference voltages R1, and R2, and R3 which are respectively placed between the two adjacent threshold voltage states P1/P2, P2/P3, and P3/P4, respectively.

The obtaining the first read reference voltages R11/R21/R31 for time point T1, R12/R22/R32 for time point T2, and R13/R23/R33 for time point T3 by moving the default read reference voltage R1, R2, and R3, respectively, includes a process described below. In the process, the controller 70 moves the default read reference voltage R1, R2, or R3 toward the middle point between the two adjacent threshold voltage states P1/P2, P2/P3, or P3/P4. In the mean time, when a moving distance (change) of the default read reference voltage R1, R2, or R3 reaches or exceeds the half read error margin m at time point T1, T2, or T3, the threshold voltage corresponding to the time point T1, T2, or T3 is determined as an optimum read reference voltage R11/R21/R31 for time point T1, an optimum read reference voltage R12/R22/R32 for time point T2, or an optimum read reference voltage R13/R23/R33 for time point T3. Then the controller creates a look-up table (refer to FIG. 12) containing the optimum read reference voltages R11/R21/R31 for time point T1, R12/R22/R32 for time point T2, or R13/R23/R33 for time point T3 and stores it in the data storage region 48 of the NAND flash memory 50.

The process of obtaining the second read reference voltage R111/R211/R311 for any one of the word line groups G1 to G3, R122/R222/R322 for any one of the word line groups G1 to G3, or R133/R233/R333 for any one of the word line groups G1 to G3 by moving the first read reference voltage R11/R21/R31 for time point T1, R12/R22/R32 for time point T2, or R13/R23/R33 for time point T3 is performed in a manner described below. That is, the controller 70 moves the first read reference voltage R11/R21/R31 for time point T1, R12/R22/R32 for time point T2, or R13/R23/R33 for time point T3, while taking into account the locations of the word line groups G1, G2, and G3. While moving the first read reference voltage according to the location of the word line group G1, G2, or G3, the controller reads the charge of each cell, one word line WL by one word line WL, in each word line group G1, G2, or G3, based on the first read reference voltage R11/R21/R21 (for time point T1), R12/R22/R32 (for time point T2), or R13/R23/R33 (for time point T3) and checks for an error. When no read error is found from any of the word line groups G1, G2, and G3 and when there is a difference in the threshold voltage among the word line groups G1, G2, and G3, each of threshold voltage differences among the word line groups G1, G2, and G3 is added to the first read reference voltage R11/R21/R21 (for time point T1), R12/R22/R32 (for time point T2), or R13/R23/R33 (for time point T3) to produce the optimal read reference voltage R111/R211/R311 from any one of the word line groups G1 to G3, the optimal read reference voltage R122/R222/R322 from any one of the word line groups G1 to G3, and the optimal read reference voltage R133/R233/R333 from any one of the word line groups G1 to G3. After that, the controller creates a second look-up table by adding the optimum read reference voltages R111/R211/R311, R122/R222/R322, and R133/R233/R333 to a first look-up table, and stores the second look-up table in the data storage region 48 of the NAND flash memory 50.

Figures 13, 14:
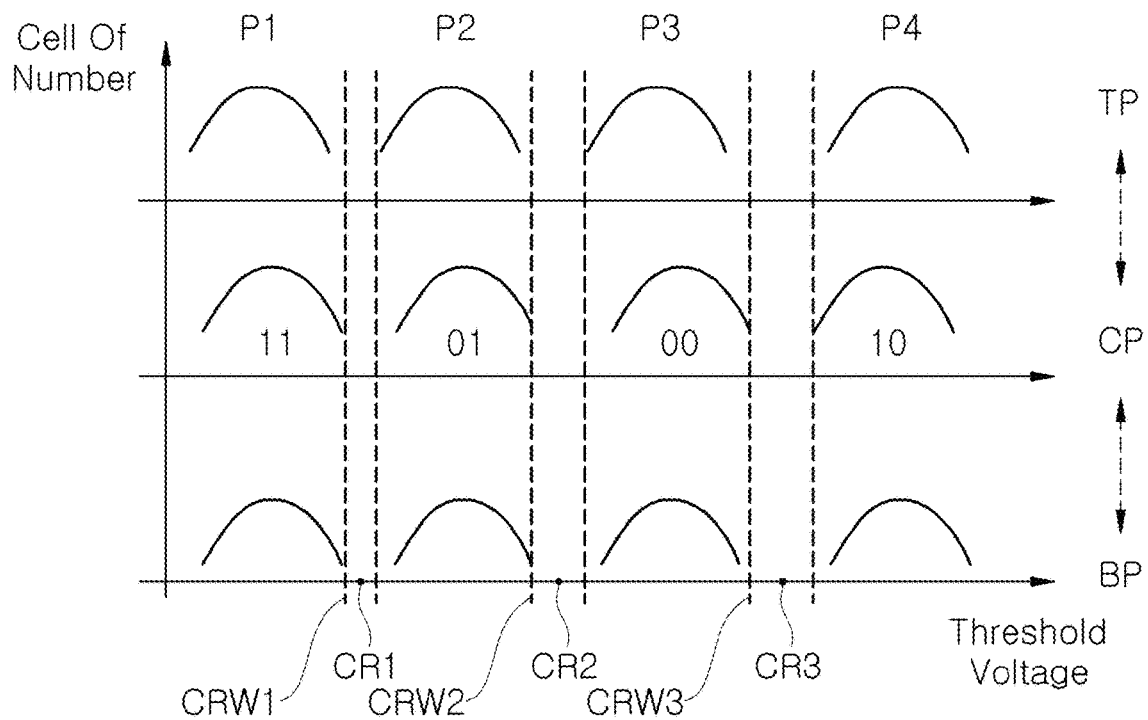

FIGS. 13 and 14 illustrate a read retry algorithm according to a fourth embodiment of the present invention, which is to be used in the storage device of FIG. 3, in which FIG. 13 is a graph and FIG. 14 is a table.

Referring to FIGS. 13 and 14, the read retry algorithm is configured to adjust the positions of the default read reference voltages (R1, R2, and R3 of FIG. 4). The adjustment of the default read reference voltages is performed by grouping the readable cells into groups according to the locations of the word lines thereof and a read reference voltage providing a maximum read margin for each group is set. In this case, pages belonging to the same group will have an optimized read margin with the use of the set read reference voltage. However, pages belonging to the other groups may have an insufficient read margin when using the read reference voltage, so that an ECC correction for the pages may be failed. In this case, a read retry operation is performed for those pages using different voltages within the look-up table. This is disadvantageous in that it degrades the operation performance of the storage device 80.

In an earlier stage of use of the NAND flash memory 50, that is, when the NAND flash memory almost does not age, a read margin between adjacent threshold voltage states is large. Therefore, as illustrated in FIG. 13, there exist common read windows CR1, CR2, and CR3. In the process of adjusting the default read reference voltages, common read reference voltage values extracted from the common read windows will be added as an information piece for the optimum read reference voltage per word line group, to the look-up table for a read retry. At the early stage of the use of the NAND flash memory 50, these values may be preferentially utilized prior to the use of the read reference voltage values per word line group and the read retry will not be performed. This results in improvement in the operation performance of the storage device 80. In contract, when the NAND flash memory 50 ages over time and thus the common read windows are narrowed, these values may not be included in the look-up table prepared for the read retry.

Particularly, the adjustment of the default read reference voltages is performed in a manner described below. As illustrated in FIG. 4 or 13, on the basis of the threshold voltage distribution graph, the controller 70 performs the adjustment with reference to common read windows CRW1, CRW2, and CRW3, which are respectively set between the adjacent threshold voltage states P1 and P2, P2 and P3, and P3 and P4, which are marked at the same positions on the x axis, for each page among a bottom page (BP), a center page (CP), and a top page (TP) within one block of the NAND flash memory 50.

According to the present invention, the adjustment of the default read reference voltages is performed taking into account the word line loading effect and the word line resistance, obtained from preliminary test results of the NAND flash memory 50 of the storage device 80, according to the locations of the pages TP, CP, and BP in one block of the NAND flash memory 50. That is, the adjustment is performed with reference to the common read window CRW1, CRW2, or CRW3 set between the two adjacent threshold voltage states P1 and P2, P2 and P3, or P3 and P4, which are the same for each of the pages TP, CP, and BP, on the basis of the threshold voltage distribution graph of FIG. 4 or 13.

The adjustment of the default read reference voltages is performed in a manner described below. That is, the controller 70 performs a read operation on the NAND flash memory 50. As a result, when it is found that any one of the default read reference voltage R1, R2, and R3 is deviated from the middle point between the corresponding adjacent threshold voltage states P1 and P2, P2 and P3, or P3 and P4 on the threshold voltage distribution graph of FIG. 4 or 13, the controller 70 finds the read error margins between each of the threshold voltage states P1, P2, P3, and P4 on a page basis, that is, for each of the pages BP, CP, and TP. Then, the controller 70 sets the common read windows CRW1, CRW2, and CRW3, which are common for the pages BP, CP, and TP and are set respectively between the adjacent threshold voltage stages P1 and P2, P2 and P3, and P3 and P4, from the threshold voltage distribution graph. Next, the controller 70 moves the default read reference voltages R1, R2, and R3 toward the common read windows CRW1, CRW2, and CRW3, respectively so that the default read reference voltages R1, R2, and R3 can be located respectively within the common read windows CRW1, CRW2, and CRW3, and finds the first read reference voltages CR1, CR2, and CR3 respectively from the common read windows CRW1, CRW2, and CRW3.

The setting of the common read windows CRW1, CRW2, and CRW3 is performed in a manner described below. The controller 70 finds the common read windows CRW1, CRW2, and CRW3 that do not generate read errors, are positioned at the same locations, and guarantee a read error margin in each of the pages BP, CP, and TP, on the basis of the threshold voltage distribution graph of FIG. 4 or 13, wherein the common read windows CRW1, CRW2, and CRW3 are respectively positioned between the adjacent threshold voltage states pairs P1 and P2, P2 and P3, and P3 and P4. After that, the controller 70 creates a first look-up table (refer to FIG. 14) containing the common read windows CRW1, CRW2, and CRW3 and stores the first look-up table in the data storage region 48 of the NAND flash memory 50.

The finding of the first read reference voltages CR1, CR2, and CR3 is performed in a manner described below. The controller 70 moves the default read reference voltages R1, R2, and R3 respectively toward the common read windows CRW1, CRW2, and CRW3, on the basis of the threshold voltage distribution graph of FIG. 4 or 13, and positions the default read reference voltages R1, R2, and R3 at the middle points of the common read windows CRW1, CRW2, and CRW3, respectively. Next, the controller 70 finds the threshold voltages having the maximum read error margin within the common read windows CRW1, CRW2, and CRW3, respectively, and determines those values as the optimum read reference voltages CR1, CR2, and CR3, respectively. Next, the controller 70 creates a second look-up table (refer to FIG. 14) by adding the optimum read reference voltages CR1, CR2, and CR3 to the default look-up table, and stores the second look-up table in the data storage region 48 of the NAND flash memory 50.

Figures 15, 16:
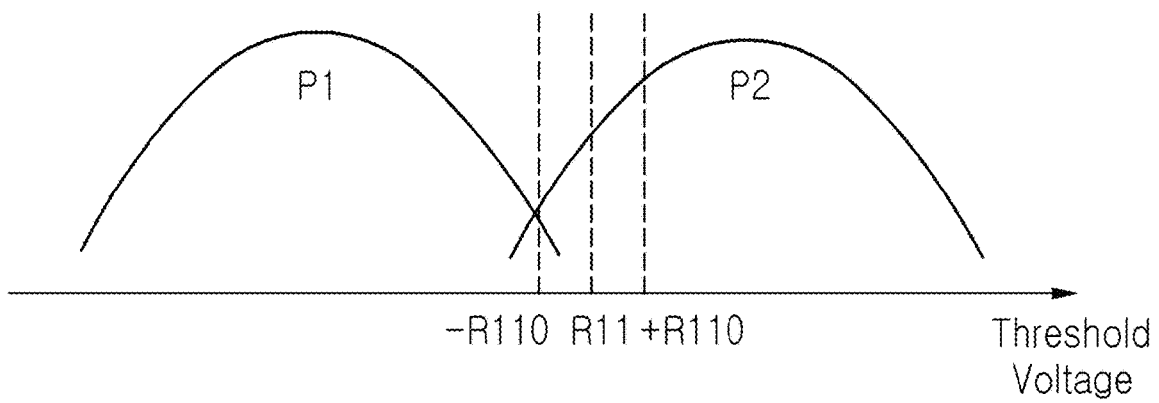

FIGS. 15 and 16 are a graph and table illustrating a read retry algorithm according to a fifth embodiment of the present invention, which is to be used in the storage device 80 of FIG. 3.

Referring to FIGS. 15 and 16, the read retry algorithm is configured to adjust the positions of the default read reference voltages (refer to R1, R2, and R3 of FIG. 4). The adjustment of the default read reference voltages R1, R2, and R3 is performed by the controller 70, according to the retention degradation stages (T1, T2, and T3 of FIG. 8) of the NAND flash memory cells falling within one threshold voltage state distribution P1, P2, P3 or P4, on the basis of the threshold voltage distribution graph of FIG. 4 or 13, rather than considering two adjacent threshold voltage states P1 and P2, P2 and P3, or P3 and P4.

For convenience of a description of the present invention, an example will be given for only two threshold voltage states P1 and P2. To adjust the default read reference voltages, the controller 70 determines the retention degradation stage of the NAND flash memory 50 mounted in the storage device 80, according to a storage time of the NAND flash memory 50 in a NAND flash memory manufacturing company and a storage time of the NAND flash memory 50 in a storage device manufacturing company. Then, on the basis of a threshold voltage distribution graph of FIG. 15 in which distributions of two adjacent threshold voltage states P1 and P2 are shown, the controller 70 adjusts the default reference voltage according to the first read reference voltage (refer to FIG. 8, R11/R21/R31 for time point T1 or R12/R22/R32 for time point T2, or R13/R23/R33 for time point T3) of the NAND flash memory cells corresponding to the distribution of one threshold voltage state (P1, P2, P3, or P4).

More specifically, the adjustment of the default read reference voltages is performed in a manner described below. First, the controller 70 performs a read operation on the NAND flash memory 50 and obtains a threshold voltage distribution graph of FIG. 15. Then, when the default reference voltage R1 is spaced from the middle point between the adjacent threshold voltage states P1 and P2 by the value of the first read reference voltage (for example, R11 for T1), the controller 70 sets offset read reference voltages −R110 and +R110 which are disposed at opposite sides and at the distance from the middle point between the adjacent threshold voltage states P1 and P2. Next, the controller 70 moves the first read reference voltage R11 toward each of the offset read reference voltage −R110 and +R110, creates a look-up table by inserting the offset read reference voltage −R110 or +R110 into the default look-up table associated with the default read reference voltage R1, and stores the look-up table in the data storage region of the NAND flash memory 50.

Adjustment of each of the default read reference voltages R2 and R3 will be performed in the same way. Thus, the default read reference voltages R1, R2, and R3 are changed to the offset read reference voltage R110, R210, Rand 310, respectively.

Next, a method of operating a storage device, according to the present invention, will be described with reference to the first to fifth embodiments (refer to FIGS. 1 to 16).

Referring to FIGS. 1 to 16, a storage device 80 includes a NAND flash memory including a plurality of cells divided into pages wherein a page is a basic operation unit for write and read) and into blocks wherein a block is a basic operation unit for erase. The cells are N-bit multi-level cells (MLC) each of which can be programmed to any one of $2^N$ threshold voltage states wherein N is the number of bits. The method performs a read operation on the cells using $2^N-1$ read reference voltages located to separates the 2N threshold voltage states from each other.

The method of operating the storage device 80 includes: a process of loading a look-up table (i.e., individual look-up tables or a combined look-up table illustrated in any one of FIGS. 5, 8, 12, 14, and 16), which contains first read reference voltages obtained taking into account threshold voltage shifts of the cells in one block according to retention degradation stages of the cells, and second read reference voltages obtained taking into a variation in threshold voltage according to pages (i.e. word line groups) in one block; and a process of performing a reading operation on the cells of one block of the NAND flash memory by using the first read reference voltages corresponding to a current retention degradation stage of the corresponding block, the second read reference voltages, or both until all of the cells are correctively read.

Since the method of operating the storage device 80, according to the present invention, performs a read operation by using only the read reference voltages corresponding to the current retention degradation stage of the NAND flash memory cells, it is possible to improve the operation performance of the storage device 80 compared with an operation method of using all of read reference voltages specified in the look-up table regardless of the retention degradation stages.

Firstly, the determination of the retention degradation stage is performed through a step of sequentially applying the first read reference voltages and the second read reference voltages to the NAND flash memory cells in one block and a step of selecting a retention degradation stage corresponding to the read reference voltage with which all of the cells in the block can be correctly read, as the current retention degradation stage. Thus, it is possible to manage the retention degradation stage on a per-block basis. The retention degradation stage of each block is initialized upon performing an erase operation.

In the operation method according to the present invention, when reading of the cells is not successful with any of the first read reference voltage and the second read reference voltages, the method further performs a process of performing a read on those cells by sequentially applying the first read reference voltage corresponding to a different retention degradation stage and the second read reference voltages.

The first read reference voltages can be obtained by first extracting a common read window for a plurality of pages from the look-up table corresponding to each retention degradation stage and selecting a voltage within the common read window.

The operation method of the present invention may further include a process of performing a soft decision error correction operation when the data of the cells cannot be correctly read with any of the read reference voltage within the look-up table. That is, a read retry is performed by increasing and decreasing the first read reference voltage corresponding the last retention degradation stage in one block and on the location of the corresponding page of the cells in the block, by an equal offset value.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of operating a storage device including an N-bit multi-level cell (MLC) NAND flash memory including memory cells grouped into a plurality of pages for a read or write operation which is performed on a per-page basis and into a plurality of blocks for an erase operation which is performed on a per-block basis, each block comprising a plurality of pages, each of the memory cells being programmed to any one of the $2^N$ threshold voltage states separated by $2^N-1$ read reference voltages (N is an integer number greater than zero and represents the number of bits), the method comprising:

by a controller provided in the storage device, loading a look-up table, into a memory region, containing a plurality of first read reference voltage sets and a plurality of second read reference voltage sets, the plurality of first read reference voltage sets corresponding to threshold voltage shift amounts varying depending on retention degradation stages of the memory cells for each block, the plurality of second read reference voltage sets corresponding to the threshold voltage shift amounts varying depending on pages in one block of the plurality of blocks, wherein the plurality of second read reference voltage sets vary depending on positions of word lines of the pages in the one block; and by the controller, performing a read operation on the memory cells block by block, using the plurality of the first read reference voltage sets corresponding to a current retention degradation stage of the corresponding block, the plurality of second read reference voltage sets, or both until all of the memory cells in the corresponding block are correctly read, wherein the retention degradation stages are obtained by segmenting, at a plurality of time points, changes in a threshold voltage with respect to a retention time such that a difference between the threshold voltages at two adjacent time points corresponds to a read error margin between two adjacent threshold voltage states, and wherein the plurality of first read reference voltage sets correspond to the threshold voltages at the plurality of time points, and wherein the difference between the threshold voltage at the two adjacent time points is a half of the read error margin between the two adjacent threshold voltage states.

2. The method according to claim 1, wherein the look-up table is created by the controller after the controller checks the read error margin, which is a voltage gap between the two adjacent threshold voltage states of the $2^N$ threshold voltage states, based on a positional relationship between each of the $2^N-1$ read reference voltages and each of the $2^N$ threshold voltage states, after the storage device comprising the NAND flash memory and the controller is manufactured.

3. The method according to claim 1, wherein a retention degradation stage is firstly determined by performing the read operation on the memory cells in one block of the NAND flash memory while sequentially applying the first read reference voltage sets and the second read reference voltage sets, one after another, selecting the retention degradation stage corresponding to the read reference voltage with which the cells in the block are correctly read as a current retention degradation degree for the corresponding block, managing the retention degradation stage information on a per-block basis, and initializing the retention degradation stage of each block upon performing an erase operation.

4. The method according to claim 3, wherein when the read operation performed on the cells with the first reference voltage set and the second read reference voltage set corresponding to the current retention degradation stage is failed, another read operation is sequentially performed on the memory cells block by block, using a different first read reference voltage set and a different second read reference voltage set corresponding to a different retention degradation stage.

5. The method according to claim 3, wherein, when the read operation using all of the read reference voltages within the look-up table is failed, a soft decision error correction operation is performed in which another read operation is further performed with a read reference voltage obtained by adding or subtracting an offset reference voltage to and from the first read reference voltage, based on a latest retention stage of the cells in one block and a position of a page in the block.

6. The method according to claim 1, wherein the first read reference voltage set is obtained by extracting a common read window for the plurality of pages at the retention degradation stage of the look-up table, wherein the read reference voltage set includes voltages selected within the common read window.

7. The method according to claim 1, wherein the word lines are grouped into a plurality of groups according to the positions of the word lines, and the plurality of second read reference voltage sets vary depending on a group of the plurality of groups corresponding to a word line connected to each page in the one block.

8. The method according to claim 1, wherein the threshold voltage shift amounts for different memory cells in at least one of the plurality of first read reference voltage sets and the plurality of second read reference voltage sets vary depending on positions of the memory cells in the NAND flash memory due to different sizes of at least some of the memory cells at different positions in the NAND flash memory.

* * * * *